(12) United States Patent
Geisler

(10) Patent No.: US 9,719,673 B2
(45) Date of Patent: Aug. 1, 2017

(54) RACK MOUNTED LIGHT

(71) Applicant: 3M INNOVATIVE PROPERTIES COMPANY, St. Paul, MN (US)

(72) Inventor: Karl J. L. Geisler, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 347 days.

(21) Appl. No.: 14/397,503

(22) PCT Filed: Apr. 18, 2013

(86) PCT No.: PCT/US2013/037073
§ 371 (c)(1),
(2) Date: Oct. 28, 2014

(87) PCT Pub. No.: WO2013/165694
PCT Pub. Date: Nov. 7, 2013

(65) Prior Publication Data
US 2015/0131270 A1    May 14, 2015

Related U.S. Application Data

(60) Provisional application No. 61/641,405, filed on May 2, 2012.

(51) Int. Cl.
*F21V 33/00* (2006.01)
*H05K 7/14* (2006.01)
(Continued)

(52) U.S. Cl.
CPC ............ *F21V 33/002* (2013.01); *F21V 29/56* (2015.01); *F21V 29/60* (2015.01); *G02B 6/0096* (2013.01);
(Continued)

(58) Field of Classification Search
CPC ........ F21V 33/002; F21V 29/56; F21V 29/60; F21Y 2101/00; G02B 6/0096; H05K 7/14; H05K 7/1485; F21W 2131/301
(Continued)

(56) References Cited

U.S. PATENT DOCUMENTS 5,057,977 A * 10/1991 Kurzman ................ A47F 3/063
312/122
7,719,835 B1   5/2010 Schluter
(Continued)

FOREIGN PATENT DOCUMENTS

JP        11-25726        1/1999
JP        2009-135016     6/2009
(Continued)

OTHER PUBLICATIONS

Jonathan, "Growth in Data Center Electricity Use 2005 to 2010", 2011, [online] [retrieved from internet in Nov. 23, 2015, URL <http://www.analyticspress.com/datacenters.html>, 1 page.
(Continued)

*Primary Examiner* — Laura Tso
(74) *Attorney, Agent, or Firm* — Jeffrey M. Olofson

(57) ABSTRACT

Generally, the present disclosure provides for a light engine, in particular a rack-mounted light engine that can be used in a lighting system. The rack mounted light engine can be positioned in an electronics component rack such a light distribution system using hollow light ducts may distribute the light over a large area, such as a data center. Such a light distribution can use a generated light more efficiently by directing the light to the fronts or backs of the electronics cabinet, rather than for general room illumination.

34 Claims, 6 Drawing Sheets

(51) Int. Cl.
*F21V 29/56* (2015.01)
*F21V 29/60* (2015.01)
*F21V 8/00* (2006.01)
*F21W 131/301* (2006.01)
*F21Y 115/10* (2016.01)

(52) U.S. Cl.
CPC ............. *H05K 7/14* (2013.01); *H05K 7/1485* (2013.01); *F21W 2131/301* (2013.01); *F21Y 2115/10* (2016.08)

(58) Field of Classification Search
USPC .................................... 362/133, 145, 249.02
See application file for complete search history.

(56) References Cited

U.S. PATENT DOCUMENTS

| | | | |
|---|---|---|---|
| 7,837,352 | B2 | 11/2010 | Graybill |
| 8,251,527 | B1 | 8/2012 | Freier |
| 2008/0158831 | A1* | 7/2008 | Cox ..................... H05K 7/1494 361/727 |
| 2009/0154159 | A1 | 6/2009 | Graybill |
| 2010/0031564 | A1* | 2/2010 | Loebl ....................... A01G 9/16 47/39 |
| 2010/0070071 | A1* | 3/2010 | Janton .................... B65G 1/137 700/216 |
| 2011/0215689 | A1* | 9/2011 | Wegener ............. A47L 15/4246 312/228.1 |
| 2012/0057350 | A1 | 3/2012 | Freier |

FOREIGN PATENT DOCUMENTS

| | | |
|---|---|---|
| JP | 2009-217947 | 9/2009 |
| JP | 2011-039754 | 2/2011 |
| WO | WO 2008-131561 | 11/2008 |
| WO | WO 2012-138503 | 10/2012 |
| WO | WO 2012-138595 | 10/2012 |
| WO | WO 2013-106365 | 7/2013 |

OTHER PUBLICATIONS

Sweeney, "Reducing Data Center Power Consumption and Energy Consumption: Saving Money and 'Going Green'," GTSI Corp., Jan. 2010, URL <http://www.gtsi.com/cms/documents/white-papers/green-it.pdf>, 16 pages.
Christian, "Projecting Annual New Data Center Construction Market Size", Microsoft Global Foundation Services, Mar. 2011, <http://www.globalfoundationservices.com/infrastructure/documents/Projecting_Annual_New_Data_Center_Construction_PDF.pdf>, 9 pages.
Mitchell, "Data Centers Take the LEED", Feb. 15, 2008, [online] [retrieved from internet in Nov. 20, 2015], ULR <http://www.computerworld.com/s/article/9062458/Data_centers_take_the_LEED>, 2 pages.
Rasmussen, "Data Center Projects: Establishing a Floor Plan", 2015, ULR <http://www.apcmedia.com/salestools/VAVR-6KYMZ7_R1_EN.pdf>, 21 pages.
International Search Report for PCT International Application No. PCT/US2013/037073 mailed on Sep. 11, 2013, 3 pages.
MacKinnon, Chris, "Data Center Lighting: Can You Save Money & Energy at the Same Time?" Processor, vol. 31, No. 19, p. 36, Jul. 17, 2009. Web. Oct. 27, 2011. http://www.processor.com/editorial/article.asp?article=articles%2Fp3119%2F35p19%2F35p19%2F35p19.asp.
Market Awareness & Profile: Wave 5, Digital Realty Trust, Feb. 2011. Web. Oct. 27, 2011. <http://knowledge.digitalrealtytrust.com/wp-content/uploads/2011-Whats-Driving-the-US-Datacenter-Market.pdf>.
Cisco Visual Networking Index: Forecast and Methodology, 2010-2015, San Jose, CA: Cisco, Jun. 1, 2011. Web. Oct. 27, 2011. http://www.cisco.com/en/US/solutions/collateral/ns341/ns525/ns537/ns705/ns827/white_paper_c11-481360.pdf.

* cited by examiner

RACK MOUNTED LIGHT

CROSS REFERENCE TO RELATED APPLICATIONS

This application is a national stage filing under 35 U.S.C. 371 of PCT/US2013/037073, filed Apr. 18, 2013, which claims priority to U.S. Provisional Application No. 61/641,405, filed May 2, 2012, the disclosure of which is incorporated by reference in its/their entirety herein.

BACKGROUND

Data centers account for approximately 2% of total electricity use in the U.S., and it has been estimated that energy efficient lighting and controls could reduce total data center energy use by 4%. Driven by 15% compound annual growth rate in internet traffic, new construction in the data center industry may represent ideal early-adopters of advanced LED lighting systems. Data center facilities are well-accustomed to large capital investments and have a deep appreciation for the long-term economics of energy efficiency. In addition, LEED certification and other green initiatives are finding increased importance in data center construction.

Light management tends to receive little attention in most data centers, and, as a result, most tend to rely on overhead fluorescent fixtures that over-illuminate the tops of server racks and aisle flooring in order to provide sufficient illumination of equipment panels. Advanced light management techniques using solid-state lighting elements and fixtures with controlled, directional output can provide significant energy and cost savings. Additional efficiencies can be achieved through intelligent sensing and control, including occupancy sensing and dynamic scheduling.

SUMMARY

Generally, the present disclosure provides for a light engine, in particular a rack-mounted light engine that can be used in a lighting system. The rack mounted light engine can be positioned in an electronics component rack such a light distribution system using hollow light ducts may distribute the light over a large area, such as a data center. Such a light distribution can use a generated light more efficiently by directing the light to the fronts or backs of the electronics cabinet, rather than for general room illumination. In one aspect, the present disclosure provides a rack-mounted light engine that includes an electronics enclosure including a plurality of components that includes at least one light source, the electronics enclosure configured to be mounted on a rack in an electronics cabinet; and at least one opening in the electronics enclosure for passing an emitted light from the light source to an exterior of the electronics cabinet.

In another aspect, the present disclosure provides a lighting system that includes a rack-mounted light engine disposed in a rack adjacent to an outer surface of an electronics cabinet, the rack-mounted light engine including a light source; and a light distribution duct positioned to accept an input light from the light source and distribute the input light to illuminate at least one of a front surface or a back surface of the electronics cabinet, and also to illuminate at least one adjacent electronics cabinet.

In yet another aspect, the present disclosure provides a data center lighting system that includes a first plurality of electronics cabinets arranged in a first row; a rack-mounted light engine disposed in a rack adjacent a top surface of one of the first plurality of electronics cabinets, the rack-mounted light engine including a light source; and a light distribution duct positioned to accept an input light from the light source and distribute the input light to at least one of a front surface and a back surface of at least two of the plurality of electronics cabinets. In yet another aspect, the light distribution duct includes a transport duct extending along a length of the first row; and a plurality of light extractors disposed along the transport duct, each of the light extractors capable of directing light toward one of the front surface or the back surface of an associated electronics cabinet of the plurality of electronics cabinets. In yet another aspect, at least one of the light extractors includes an extraction duct extending in a perpendicular direction from the transport duct, the extraction duct capable of directing light toward one of the front surface or the back surface of the associated electronics cabinet of the plurality of electronics cabinets.

In yet another aspect, the present disclosure provides a data center lighting system that includes a first plurality of electronics cabinets arranged in a first row, each of the first plurality of electronics cabinets having a first surface and an opposite second surface; a second plurality of electronics cabinets arranged in a second row parallel to the first row and separated by an aisle, each of the second plurality of electronics cabinets having a third surface facing the first surface; a rack-mounted light engine disposed in a rack adjacent a top surface of one of the first plurality of electronics cabinets, the rack-mounted light engine including a light source; and a light distribution duct positioned to accept an input light from the light source and distribute the input light to the first surface of at least one of the first plurality of electronics cabinets and the third surface of at least one of the second plurality of electronics cabinets. In yet another aspect, the light distribution duct includes a transport duct extending along a length of the first row; and a first plurality of light extractors disposed along the transport duct, each of the first plurality of extractors capable of directing light toward the first surface and the third surface of associated electronics cabinets of the first and second plurality of electronics cabinets. In yet another aspect, at least one of the first plurality of light extractors includes an extraction duct extending in a perpendicular direction from the transport duct, the extraction duct capable of directing light toward the first surface and the third surface of associated electronics cabinets of the first and second plurality of electronics cabinets.

In yet another aspect, the present disclosure provides a data center lighting system that includes a first plurality of electronics cabinets arranged in a first row, each of the first plurality of electronics cabinets having a first surface and an opposite second surface; a second plurality of electronics cabinets arranged in a second row parallel to the first row and separated by an aisle, each of the second plurality of electronics cabinets having a third surface facing the first surface; a rack-mounted light engine disposed in a rack adjacent a top surface of one of the first plurality of electronics cabinets, the rack-mounted light engine including a light source; and a light distribution duct positioned to accept an input light from the light source and distribute the input light to the first surface of at least one of the first plurality of electronics cabinets and the third surface of at least one of the second plurality of electronics cabinets. The data center lighting system further includes a third plurality of electronics cabinets in a third row parallel to the first row and separated by a second aisle, each of the third plurality of electronics cabinets having a fourth surface facing the second surface, wherein the light distribution duct further distributes the input light to the second surface of at least one of the first plurality of electronics cabinets and the fourth surface of at least one of the second plurality of electronics cabinets. In yet another aspect, the light distribution duct includes a transport duct extending along a length of the first row; and a second plurality of light extractors disposed along the transport duct, each of the second plurality of light extractors capable of directing light toward the second surface and the fourth surface of associated electronics cabinets of the first and third plurality of electronics cabinets. In yet another aspect, at least one of the second plurality of light extractors includes an extraction duct extending in a perpendicular direction from the transport duct, the extraction duct capable of directing light toward the second surface and the fourth surface of associated electronics cabinets of the first and third plurality of electronics cabinets.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
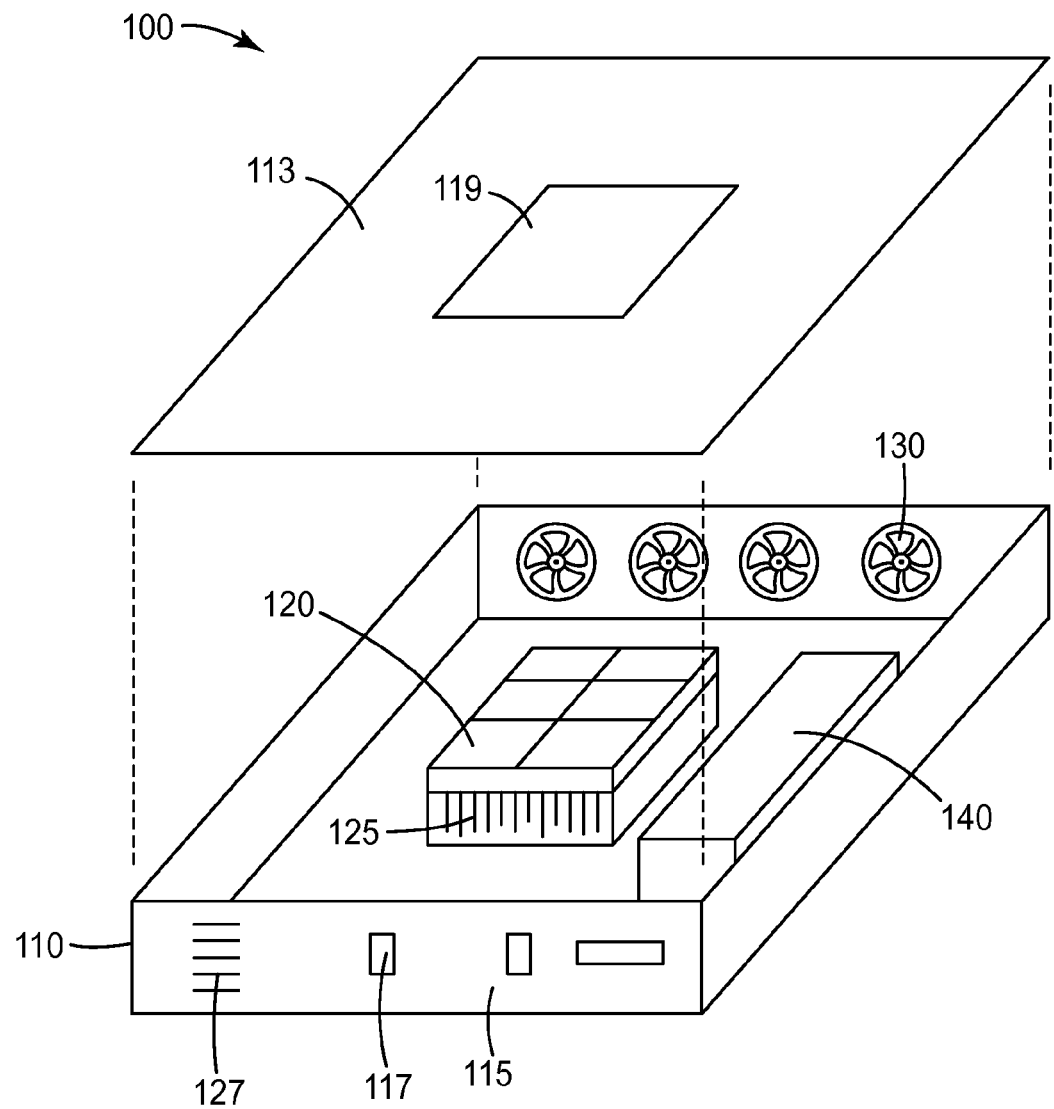
FIG. 1 shows a perspective schematic view of a rack-mounted light engine.

Generally, the present disclosure provides an apparatus including a light source or sources packaged in an enclosure suitable for mounting in a standard electronics equipment rack. The light source or sources can be any suitable light, although light emitting diodes (LEDs) can be preferred. The enclosure provides power and thermal management for the light source(s). Additional electrical circuitry may also be included to provide communications and control features. The enclosure further includes an opening or openings for emitted light, and the light sources are oriented such that light can be delivered using light ducts or other device to illuminate the outside of the rack, front and/or rear equipment panels, the room the rack is contained within, and/or adjacent room or rooms.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on," "directly connected to," "directly coupled with," or "directly in contact with" another element, there are no intervening elements, components or layers for example.

Ducted illumination is a novel architecture for the construction of light fixtures which can provides a technique to create multiple light-emitting elements from a single intense and concentrated light source. It involves substantially collimating the flux emitted by the source, transporting that flux in a hollow mirror-lined duct, and extracting the flux from the duct in a controlled and customizable manner. The long-distance transport of visible light through a building can use large mirror-lined ducts which include advantages of large cross-sectional area and large numerical aperture (enabling larger fluxes with less concentration), a robust and clear propagation medium (for example, air) that leads to both lower attenuation and longer lifetimes, and a potentially lower weight per unit of light flux transported.

The use and design of light ducts and light duct components for architectural lighting, in particular solar-assisted architectural lighting can be more effective by using very high efficiency mirrors in hollow light ducts such as, for example, Vikuiti™ Enhanced Specular Reflector (ESR) film available from 3M Company. Such mirror-lined light ducts can be uniquely enabled by the use of 3M optical films, including mirror films such as ESR film, that have greater than 98% specular reflectivity across the visible spectrum of light.

In some cases, a benefit of ducted illumination described herein is exceptional color mixing and insensitivity to device variability. Due to the multiple bounces occurring within the duct, the distance travelled, and the small size of LED arrays, light rays exiting the duct system at any point originate from points uniformly distributed across the LED array. Thus, only the mean emission from the LED array matters. Device bins are relevant only insofar as they affect this mean. Mixed-color arrays (for example RGB) will not generally produce color streaking or other non-uniformities.

In some cases, another benefit of ducted illumination described herein is an exceptional spatial and angular control of the delivered light. The base emission from luminaries or downlights can be engineered to be directed normal to the side wall of the duct and is collimated comparably to the flux output by the light engine. Any desired redirection or reduced collimated of the emission pattern can be achieved with very little efficiency loss by adding an appropriately designed structured-surface film or films.

In some cases, another benefit of ducted illumination described herein is the potential for a modular architecture. Ducted illumination systems are amenable to fabrication and sale as modular components.

In some cases, another benefit of ducted illumination described herein is that the light engines are readily maintainable and easily updated. Advances in LED technology which create devices with higher luminous efficacy, higher flux per device, smaller devices, improved spectral characteristics, diminished temperature sensitivity, and the like can be incorporated into a ducted illumination system by replacement of just the light engine. Maintenance actions on a large system are limited to only a small number of high-power light sources.

In some cases, another benefit of ducted illumination described herein is exceptional thermal control. The high efficiency of the ducts provides great flexibility in where the light sources and the waste heat they produce can be located and how that heat can be managed.

Two particularly relevant benefits apply to the datacom industry. In one aspect, given an ability to control the angular and spatial distribution of light emitted from the ducts, energy expenditures may be limited to providing useful light only where needed—task lighting on the front and rear panels of the racks, with a lower level of illuminance on the floor. Energy will not be wasted by illuminating the tops of server equipment racks. By preventing light from being emitted in directions parallel to the aisles, glare can be minimized in this direction.

In another aspect, due to the remote nature of light engines according to one particular embodiment, light and its associated waste heat can be generated outside the temperature-controlled server room to help minimize stray cooling loads. In some cases, light sources can be located inside the equipment racks themselves to leverage the efficiencies of the power and cooling infrastructure provided for the other electronic equipment. In some cases, packaging of light engines in standard computing hardware enclosure form factors may permit reliable, cost-effective lighting solutions. In some cases, novel thermal management solutions will not need to be developed and control and communication capabilities can be readily deployed within the native data center software and communications environments.

FIG. 1 shows a perspective schematic view of a rack-mounted light engine 100 according to one aspect of the disclosure. Rack mounted light engine 100 includes an electronics enclosure 110 and a top 113 that has been removed to show internal elements. A front panel 115 of the electronics enclosure 110 can include electronic controls 117 which can be switches, indicators, interfaces, and the like, useful for local control or monitoring of the rack mounted light engine 100. Top 113 includes an opening 119 disposed to pass light emitted from light source(s) 120 through to the exterior of the electronics enclosure 110. Light source(s) 120 can include a plurality of separate sources such as LEDs, and cooling devices such as heat exchangers 125, to aid the removal of heat from the light source(s) 120. Cooling devices can include a fan, an air cooled heat exchanger, a liquid cooled heat exchanger, or a combination thereof. Opening 119 can include a plurality of separate openings associated with each of the separate light source(s) 120. Electronics enclosure 110 can further include a power supply 140 including communications and control circuitry, electrically connected to light source(s) 120. Electronics enclosure 110 can further include cooling features and devices such as air vents 127 and cooling fans 130 to aid in the extraction of heat from the electronics enclosure 110. The arrangement of cooling features and devices, such as air vents 127 and cooling fans 130 can be configured to align with air flow patterns established within the rack, cabinet, aisles, or room.

In one particular embodiment, the walls of the electrical enclosure 110 may include sliding rail features (not shown), allowing the electrical enclosure 110 to slide in and out of the rack for installation and to facilitate the execution of maintenance or upgrading activities.

In one particular embodiment, at least one of the components contained within the electronics enclosure 110, such as the light source(s), cooling device(s), power supply and other circuitry, or at least one subcomponent thereof are modular so that they may be removed from the enclosure through at least one opening or removable cover in the front, back, or top surface(s) of the electrical enclosure 110, while the electrical enclosure 110 remains mounted in the rack.

Figure 2A:
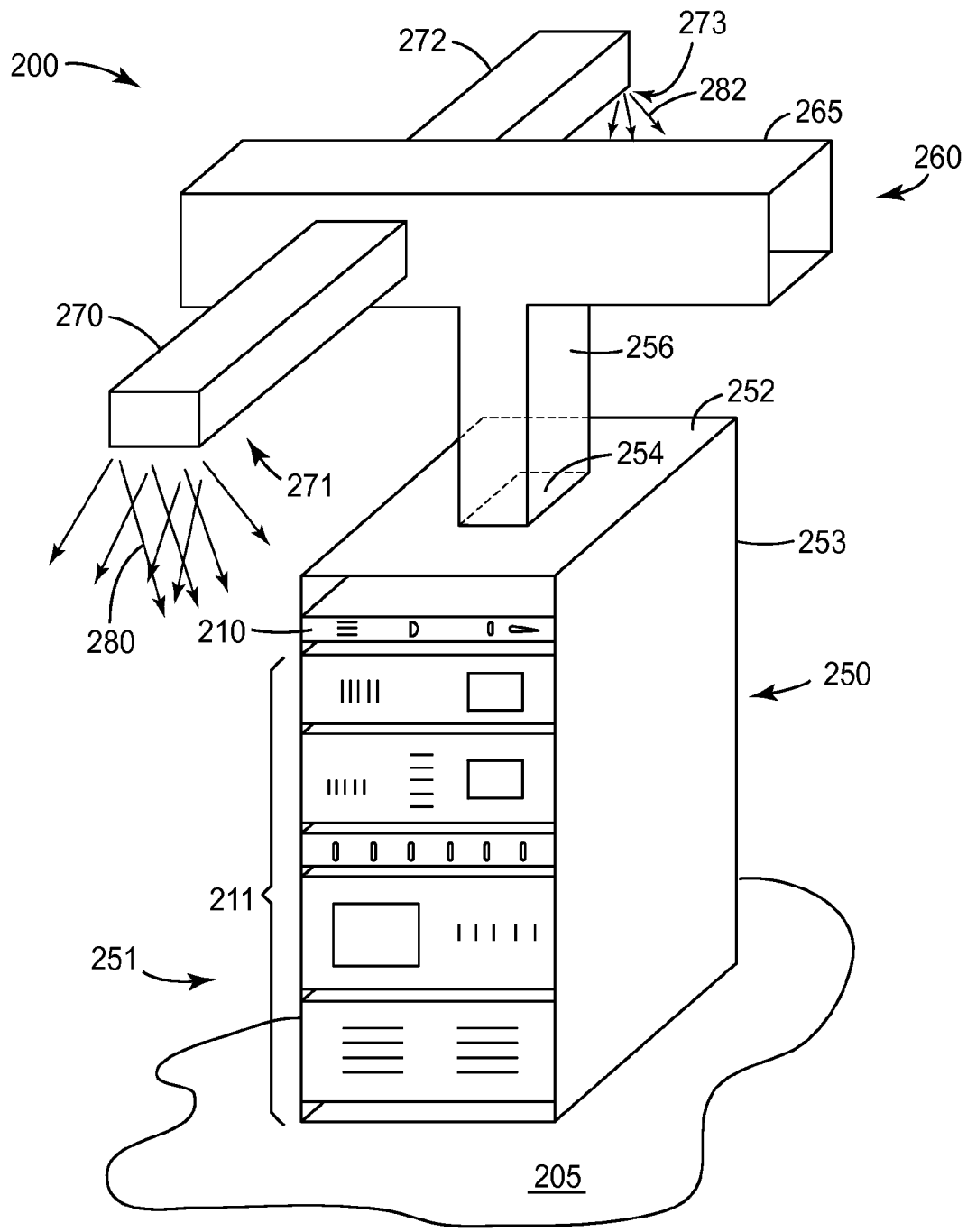
FIG. 2A shows a perspective schematic view of a lighting system.

FIG. 2A shows a perspective schematic view of a lighting system 200 according to one aspect of the disclosure. Lighting system 200 includes an electronics cabinet 250 and a light distribution duct 260 positioned to accept input light exiting from within electronics cabinet 250. Electronics cabinet 250 can be positioned on a floor 205, and includes a front 251, a back 253, and a top surface 252 having an opening 254. In some cases, the opening 254 can extend across the entire top surface 252, for example, the electronics cabinet 250 is completely open (not shown), although in FIG. 2A it is shown to extend over only a portion of the top surface 252. A plurality of electronics components 211 are stacked on the rack within electronics cabinet 250, and a rack-mounted light engine 210 is positioned adjacent to the top surface 252. Rack mounted light engine 210 can be similar to the rack mounted light engine 100 described in FIG. 1, and is mounted in the rack such that opening 119 is disposed to pass light emitted from the light source(s) 120 through opening 254 in the top surface 252 of electronics cabinet 250.

Light passing through opening 254 in top surface 252 enters an input light duct 256 and is directed through to a light transport duct 265 that extends parallel to the floor 205. In one particular embodiment, the light injected into the light transport duct 265 is partially collimated light due to the method of light generation. This partially collimated light can generally be described as being included within a cone having border light rays within a collimation half-angle θ of the central light propagation direction.

Relatively well-collimated light can be more effectively used in mirror-lined duct systems for transporting light. Generally, the collimation half-angle θ of concentrated light passing into the light duct should be restricted to no greater than about 30 degrees, or no greater than about 25 degrees, or no greater than about 20 degrees, or even no greater than about 15 degrees. In one particular embodiment, the collimation angle θ can be about 18.4 degrees for efficient transport of light. The accuracy of the various optical components within the lighting system, particularly for injecting the light into the duct, all can contribute to the resulting collimation half-angle θ.

In one particular embodiment, light transport duct 265 includes a plurality of front light extraction ducts 270 and back light extraction ducts 272, that can extend in a perpendicular orientation from the light transport duct 265. It is to be understood that both the front and back light extraction ducts 270, 272, can be included in lighting system 200, although in some cases, one or more of either the front or the back light extraction ducts 270, 272 may be excluded. Each of the front and back light extraction ducts 270, 272, can include a front light extractor 271 and a back light extractor 273 that extract and direct a front cabinet illumination light 280 and a back cabinet illumination light 282, respectively, from the light extraction ducts 270, 272. In some cases, the front light extraction ducts 270 and associated front light extractor 271 can be directed such that the front 251 of the electronics cabinet 250 is illuminated and no other adjacent cabinets (not shown) are illuminated. In some cases, the back light extraction ducts 272 and associated back light extractor 273 can also be directed such that the back 253 of the electronics cabinet 250 is illuminated and no other adjacent cabinets (not shown) are illuminated. In some cases, the front and back light extraction ducts 270, 272, can instead be directed such that one or more adjacent cabinets' front 251 and back 253 are illuminated by a single front or back light extraction duct 270, 272, respectively.

Techniques and apparatus used to extract and distribute light from light ducts has been described, for example, in U.S. Patent Application Nos. 61/379,545 entitled SWITCHABLE LIGHT DUCT EXTRACTION, filed Sep. 2, 2010; Ser. No. 13/025,251 entitled LIGHT DUCT BEND, filed Feb. 11, 2011; 61/473,220 entitled LIGHT DUCT TEE EXTRACTOR, filed Apr. 8, 2011; 61/473,225 entitled LIGHT DUCT TEE SPLITTER, filed Apr. 8, 2011; and 61/585,403 entitled LIGHT DUCT BEND, filed Jan. 11, 1012.

Figure 2B:
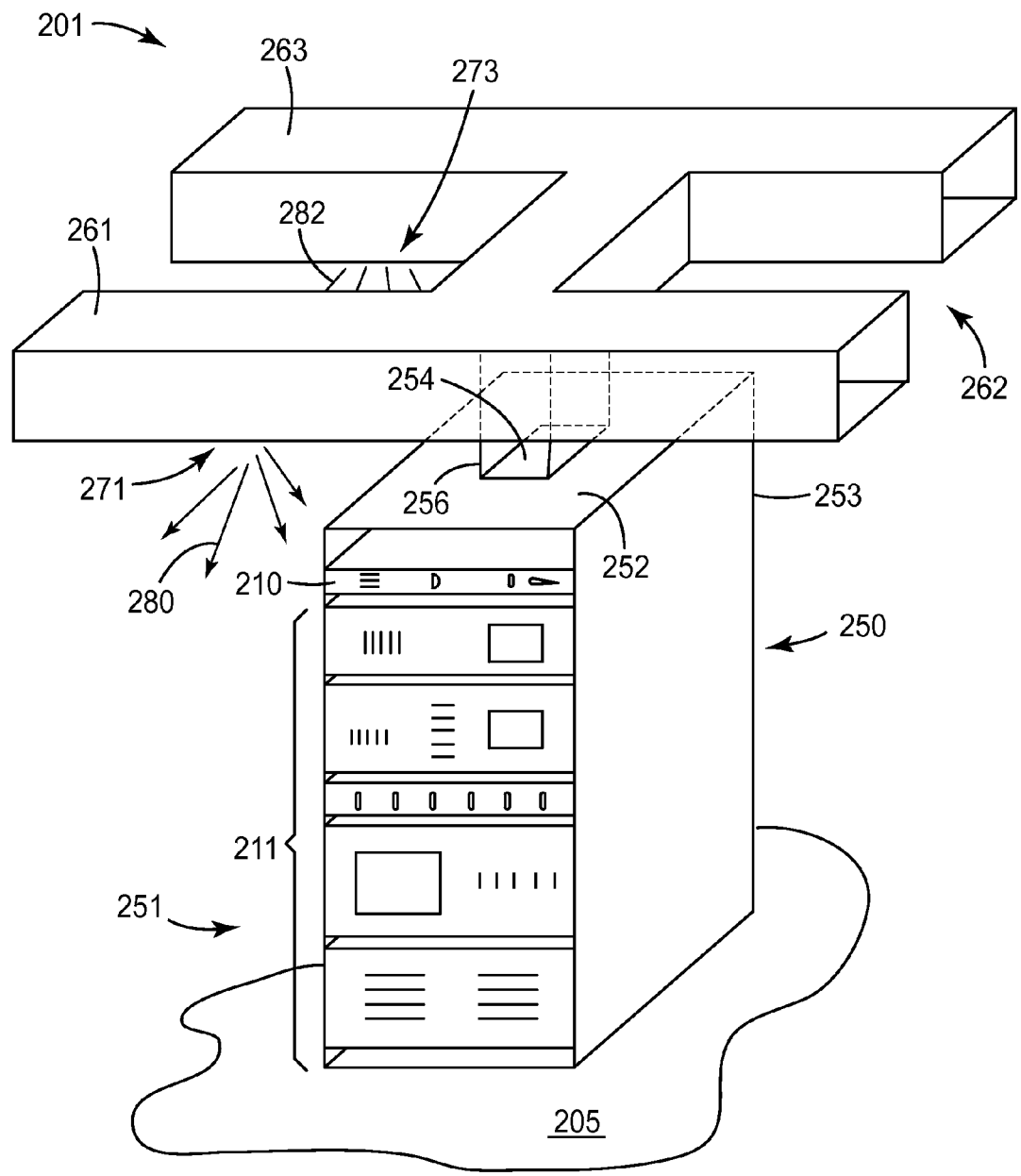
FIG. 2B shows a perspective schematic view of a lighting system.

FIG. 2B shows a perspective schematic view of a lighting system 201 according to one aspect of the disclosure. Each of the elements 205-282 shown in FIG. 2B correspond to like-numbered elements shown in FIG. 2A, which have been described previously. Lighting system 201 includes an electronics cabinet 250 and a light distribution duct 262 positioned to accept input light exiting from within electronics cabinet 250. Electronics cabinet 250 can be positioned on a floor 205, and includes a front 251, a back 253, and a top surface 252 having an opening 254. A plurality of electronics components 211 are stacked on the rack within electronics cabinet 250, and a rack-mounted light engine 210 is positioned adjacent to the top surface 252. Rack mounted light engine 210 can be similar to the rack mounted light engine 100 described in FIG. 1, and is mounted in the rack such that opening 119 is disposed to pass light emitted from the light source(s) 120 through opening 254 in the top surface 252 of electronics cabinet 250.

Light passing through opening 254 in top surface 252 enters an input light duct 256 and is directed through to a first light transport duct 261 and a second light transport duct 263. It is to be understood that both the first and second light transport ducts 261, 263, can be included in lighting system 201, although in some cases, one or more of either the first or the second light transport ducts 261, 263 may be excluded. The light injected into the first light transport duct 261 and second light transport duct 263 is generally partially collimated light due to the method of light generation, as described elsewhere. In one particular embodiment, first light transport duct 261 and second light transport duct 263 each include a plurality of light extractors 271, 273, that extract and direct front cabinet illumination light 280, and back cabinet illumination light 282, respectively, from the first light transport duct 261 and second light transport duct 263.

Each of the first and second light transport ducts 261, 263, can include a front light extractor 271 and a back light extractor 273 that extract and direct a front cabinet illumination light 280 and a back cabinet illumination light 282, respectively, from the first and second light transport ducts 261, 263. In some cases, each front light extractor 271 can be directed such that the front 251 of the electronics cabinet 250 is illuminated and no other adjacent cabinets (not shown) are illuminated. In some cases, the back light extractor 273 can also be directed such that the back 253 of the electronics cabinet 250 is illuminated and no other adjacent cabinets (not shown) are illuminated. In some cases, the front and back light extractors 271, 273, can instead be directed such that one or more adjacent cabinets' front 251 and back 253 are illuminated by a single front or back light extractors 271, 273, respectively.

Figure 3A:
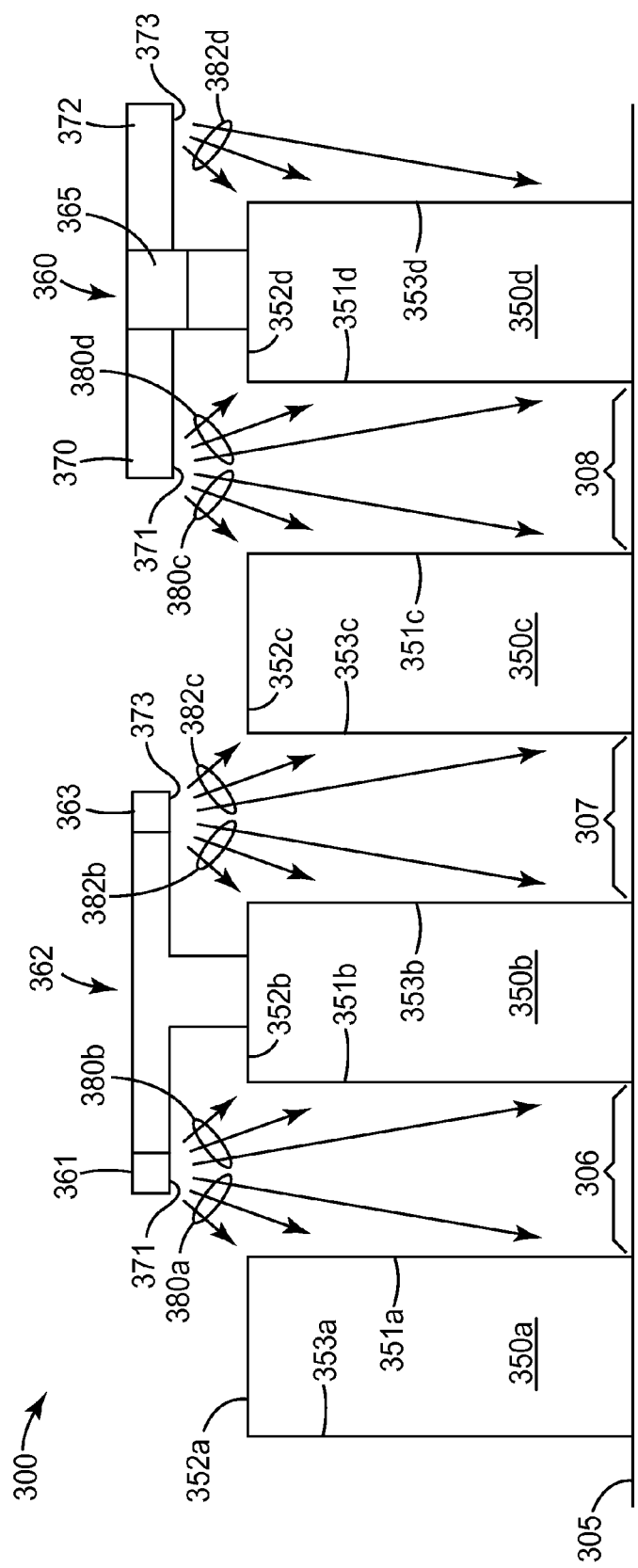
FIG. 3A shows a schematic end view of a data center lighting system.

FIG. 3A shows a schematic end view of a data center lighting system 300 according to one aspect of the disclosure. Each of the elements 305-382 shown in FIG. 3A correspond to like-numbered elements shown in FIGS. 2A and 2B, which have been described previously. For example, floor 305 in FIG. 3A corresponds to floor 205 in FIGS. 2A and 2B, and so on. Data center lighting system 300 includes a plurality of rows of electronics cabinets all disposed on a floor 305 of a data center. For purposes of description, shown in FIG. 3A are a series of four rows, although it is to be understood that more or fewer rows may be present. Data center lighting system 300 shows examples of the two lighting systems 200, 201, shown and described in FIGS. 2A and 2B, respectively. It is to be understood that either lighting system 200, or lighting system 201, would typically be used exclusively for lighting the data center, although in some cases a combination of the two may be used.

In one particular embodiment, a first row of electronics cabinets 350a each having a first front 351a, a first back 353a, and a first top 352a, is separated by a first aisle 306 from a second row of electronics cabinets 350b each having a second front 351b, a second back 353b, and a second top 352b. In one particular embodiment, each of the first fronts 351a and second fronts 351b face each other across the first aisle 306. A third row of electronics cabinets 350c each having a third front 351c, a third back 353c, and a third top 352c, is separated by a second aisle 307 from the second row of electronics cabinets 350b. In one particular embodiment, each of the second backs 353b and third backs 353c face each other across the second aisle 307. A fourth row of electronics cabinets 350d each having a fourth front 351d, a fourth back 353d, and a fourth top 352d, is separated by a third aisle 308 from the third row of electronics cabinets 350c. In one particular embodiment, each of the third fronts 351c and fourth fronts 351d face each other across the third aisle 308. The configuration of front facing cabinets described above can be a typical arrangement provided in data centers, such that cooling air can then be input from the floor 305 in aisles separating fronts of cabinets (for example, first and third aisles 306, 308), and the heated air can be exhausted through the ceiling in aisles separating backs of cabinets (for example, second aisle 307). In some cases, the direction of airflow may be reversed, as known to one of skill in the art. In still other cases, cold air may be input from the floor beneath the cabinet, rise through vertical passageways, and exit the cabinet from the cabinet top surface (for example, 352a) as heated exhaust.

One of the electronics cabinets (for example, fourth cabinet 350b4 shown and described in FIG. 3B, below) in the second row 350b includes a lighting system similar to the lighting system 201 shown in FIG. 2B, and light is distributed from light distribution duct 362 to first light transport duct 361 and second light transport duct 363. A first and second front cabinet illumination light 380a, 380b is directed from front extractor 371 in first light transport duct 361, and illuminates the first front 351a and second front 351b of at least one electronics cabinet in both the first row 350a and second row 350b, respectively. In one particular embodiment, each of the first and second front cabinet illumination lights 380a, 380b, may be configured such that the floor 305 in the first aisle 306 is not directly illuminated. In some cases, however, they may be configured to provide at least partial direct illumination of the floor 305 in the first aisle 306.

In a similar fashion, a first and second back cabinet illumination light 382b, 382c are directed from back extractor 373 in second light transport duct 363, and illuminate the second back 353b and third back 353c of at least one electronics cabinet in both the second row 350b and third row 350c, respectively. In one particular embodiment, each of the first and second back cabinet illumination lights 382b, 382c, may be configured such that the floor 305 in the second aisle 307 is not directly illuminated. In some cases, however, they may be configured to provide at least partial direct illumination of the floor 305 in the second aisle 307.

One of the electronics cabinets (for example, fourth cabinet 350d4 shown and described in FIG. 3B, below) in the fourth row 350d includes a lighting system similar to the lighting system 200 shown in FIG. 2A, and a light distribution duct 360 includes light transport duct 365, front extraction duct 370, and back extraction duct 372. A third and fourth front cabinet illumination light 380c, 380d are directed from front extractor 371 in front extraction duct 370, and illuminate the third front 351c and fourth front 351d of at least one electronics cabinet in both the third row 350c and fourth row 350d, respectively. In one particular embodiment, each of the third and fourth front cabinet illumination lights 380c, 380d, may be configured such that the floor 305 in the third aisle 308 is not directly illuminated. In some case, however, they may be configured to provide at least partial direct illumination.

In a similar fashion, a third back cabinet illumination light 382d is directed from back extractor 373 in back extraction duct 372, and illuminates the fourth back 353d of at least one electronics cabinet in the fourth row 350d. In one particular embodiment, the third back cabinet illumination light 382d, may be configured such that the floor 305 is not directly illuminated. In some cases, however, it may be configured to provide at least partial direct illumination of the floor 305.

Figure 3B:
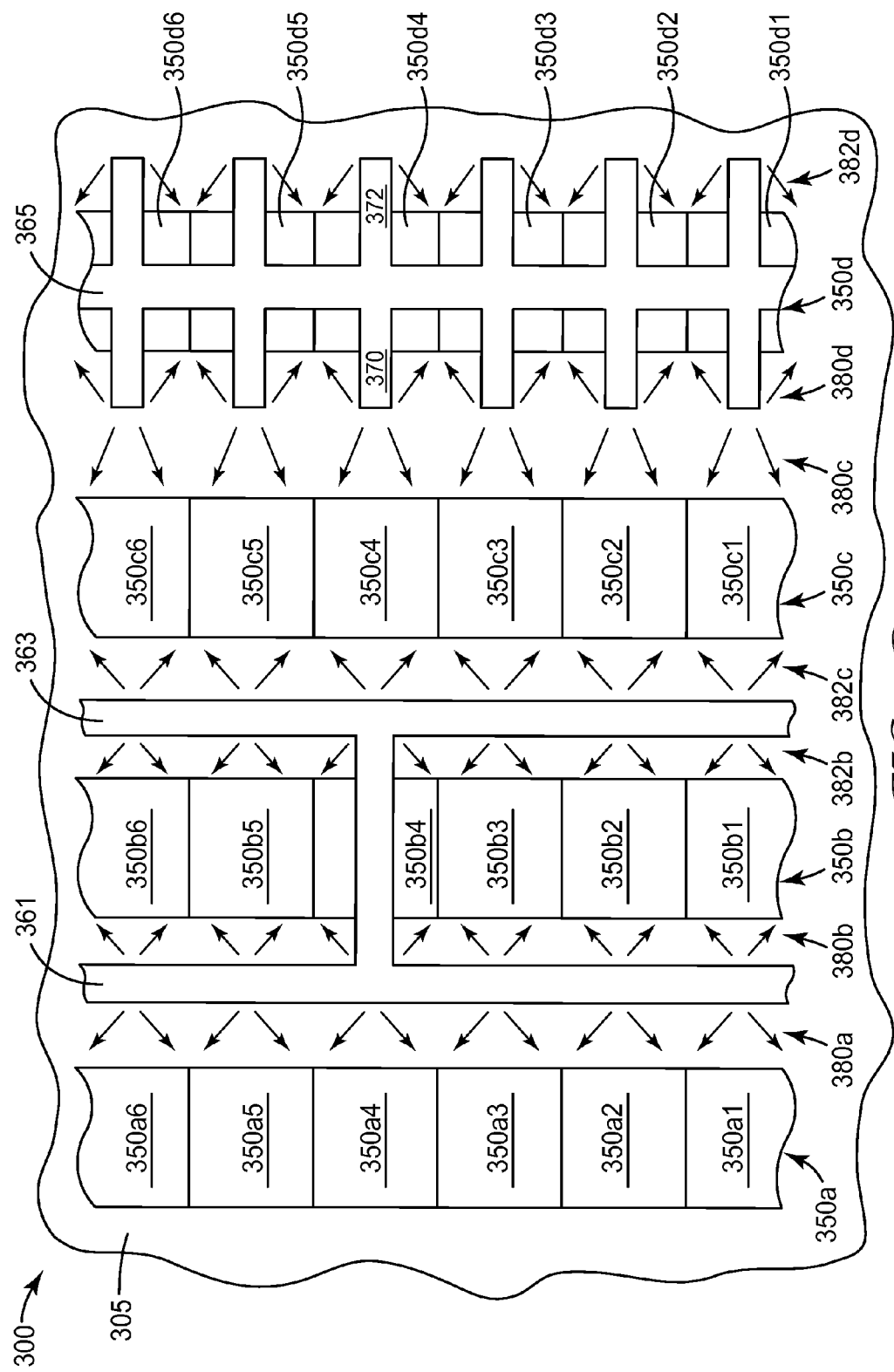
FIG. 3B shows a schematic overhead view of a data center lighting system.

FIG. 3B shows a schematic overhead view of the data center lighting system 300 shown in FIG. 3A, according to one aspect of the disclosure. Each of the elements 305-382 shown in FIG. 3B correspond to like-numbered elements shown in FIGS. 2A, 2B, and 3A, which have been described previously. For example, floor 305 in FIG. 3B corresponds to floor 205 in FIGS. 2A and 2B, and so on. FIG. 3B shows the distribution of light along a row of cabinets, by the light distribution ducts 360, 362 of FIG. 3A.

Data center lighting system 300 includes a plurality of rows of electronics cabinets all disposed on a floor 305 of a data center. For purposes of description, show in FIG. 3B is a series of four rows, although it is to be understood that more or fewer rows may be present. Further, each of the four rows as shown in FIG. 3B includes 6 electronics cabinets per row, although it is to be understood that more or fewer cabinets may be included in each row. Data center lighting system 300 in FIG. 3B shows overhead views of examples of the two lighting systems 200, 201 shown and described in FIGS. 2A and 2B, respectively. It is to be understood that either lighting system 200, or lighting system 201, would typically be used exclusively for lighting the data center, although in some cases a combination of the two may be used.

A fourth cabinet 350b in the second row of electronics cabinets 350b includes a lighting system similar to the lighting system 201 shown in FIG. 2B, and light is distributed to first light transport duct 361 and second light transport duct 363. A first and second front cabinet illumination light 380a, 380b are directed from front extractor 371 in first light transport duct 361, and a first and second back cabinet illumination light 382b, 382c are directed from back extractor 373 in second light transport duct 363.

As described elsewhere, the first front cabinet illumination light 380a illuminates at least one first front 351a of a first through a sixth first row electronics cabinets 350a1-350a6, and the second front cabinet illumination light 380b illuminates at least one second front 351b of a first through a sixth second row electronics cabinets 350b1-350b6. Similarly, also as described elsewhere, the first back cabinet illumination light 382b illuminates at least one second back 353b of a first through a sixth second row electronics cabinets 350b1-350b6, and the second back cabinet illumination light 382c illuminates at least one third back 353c of a first through a sixth third row electronics cabinets 350c1-350c6.

A fourth cabinet 350d4 in the fourth row of electronics cabinets 350d includes a lighting system similar to the lighting system 200 shown in FIG. 2A, and light distribution duct 360 includes light transport duct 365, front extraction duct 370, and back extraction duct 372. A third and fourth front cabinet illumination light 380c, 380d are directed from front extractor 371 in front extraction duct 370, and a third back cabinet illumination light 382d is directed from back extractor 373 in back extraction duct 372.

As described elsewhere, the third front cabinet illumination light 380c illuminates at least one third front 351c of a first through a sixth third row electronics cabinets 350c1-350c6, and the fourth front cabinet illumination light 380d illuminates at least one fourth front 351d of a first through a sixth fourth row electronics cabinets 350d1-350d6.

Similarly, also as described elsewhere, the third back cabinet illumination light 382d illuminates at least one fourth back 353d of a first through a sixth fourth row electronics cabinet 350d1-350d6.

Figure 4:
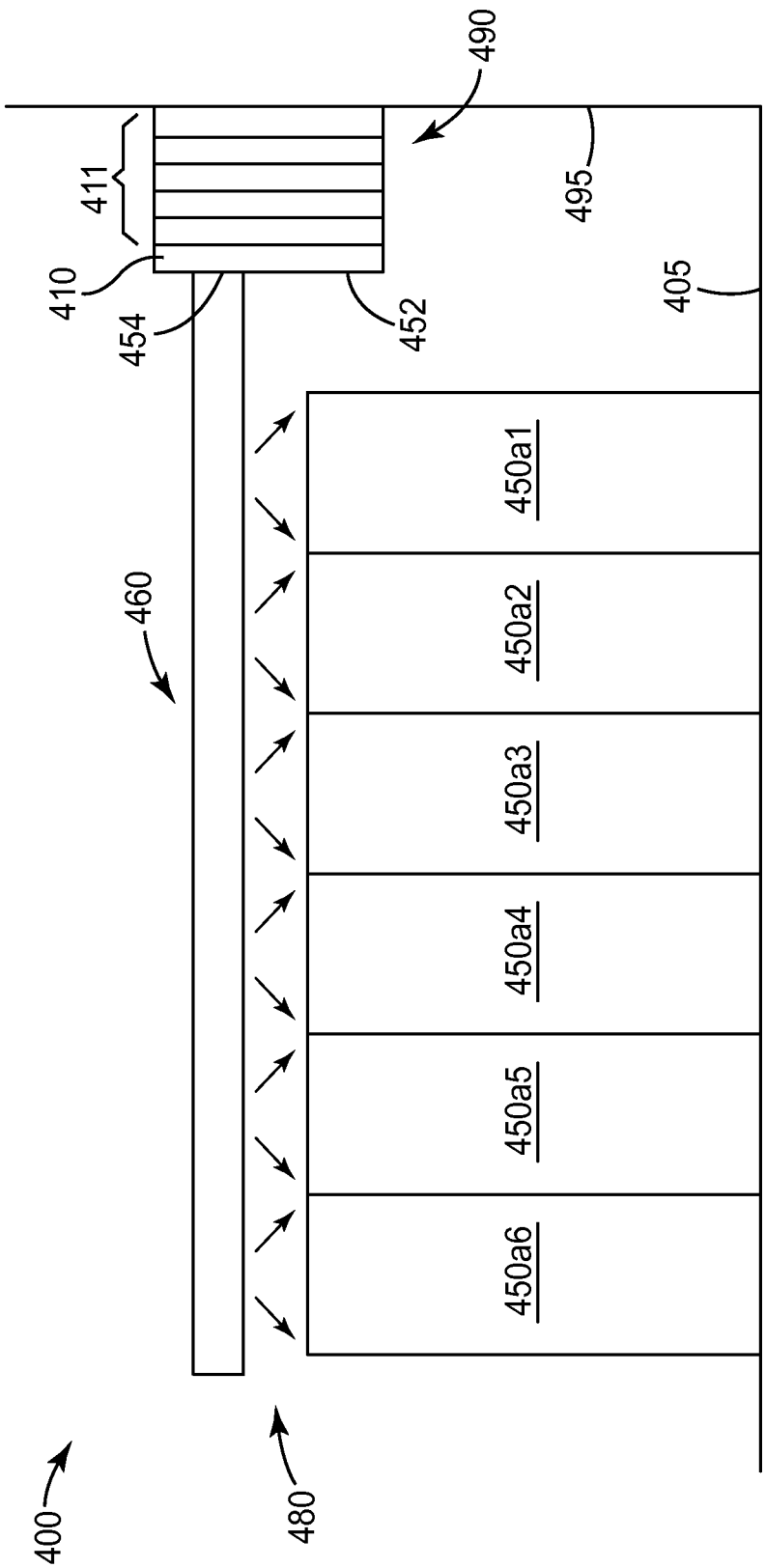
FIG. 4 shows a schematic side view of a data center lighting system.

FIG. 4 shows a schematic side view of a data center lighting system 400, according to one aspect of the disclosure. In FIG. 4, an alternative technique for lighting is described, where a wall-mounted electronics cabinet 490 includes a top surface 452, an opening 454, and a light distribution duct 460 positioned to accept input light exiting through opening 454 from within wall-mounted electronics cabinet 490. Wall-mounted electronics cabinet 490 can be positioned on a wall 495, and may include a plurality of electronics components 411 stacked on the rack within wall-mounted electronics cabinet 490, and a rack-mounted light engine 410 positioned adjacent to the top surface 452. Rack-mounted light engine 410 can be similar to the rack mounted light engine 100 described in FIG. 1, and is mounted in the rack such that opening 119 is disposed to pass light emitted from the light source(s) 120 through opening 454 in the top surface 452 of wall-mounted electronics cabinet 490. Light distribution duct 460 can include any of the extractors described elsewhere, and is configured to output extracted illumination light 480 to illuminate the fronts or backs of any of the plurality of electronics cabinets 450a1-450a6 positioned on the floor 405 of the data center. A plurality of wall-mounted electronics cabinets 490 with associated light distribution ducts 460 can be disposed within the data center as desired, and can also be used exclusively or in conjunction with any of the other lighting systems described herein. Such relatively short, wall-mounted racks could also be used for ducted illumination light engines in warehouse or other industrial applications. Light engines could be housed in racks located in utility closets, mechanical rooms, and/or service corridors for architectural applications.

The three components of a light duct system include the light engine including a collimating horn, ESR-lined transmission ductwork, and light extraction features. Each LED array can be coupled to an individual ESR-lined horn which will substantially collimate the light by the time it enters the transmission duct. The ratio of horn inlet size to outlet size determines the degree to which the light is collimated (beam angle). Transmission ducts may be of any cross-sectional shape, including circular, rectangular, and the like. One advantage of a circular cross section is that extraction features (both ESR perforations and light management films) may be easily varied around the circumference of the duct to affect the desired illumination patterns. For a data center application, it is expected that extraction features would run nearly the entire length of the transmission duct.

Examples

A prototype lighting system was fabricated to demonstrate the concept of a rack-mounted LED light engine designed to feed a ducted illumination system. This initial prototype was designed for a relatively fast and inexpensive demonstration of the concept with maximum power consumption and cooling need. The prototype consisted primarily of standard off-the-shelf components, configured to be compatible with 3 inch (7.62 cm) square duct segments lined with Vikuiti™ ESR film available from 3M Company. The various components were organized into two separate enclosures: the first contained the LED arrays, heat sinks, and fans; the second housed power supply and control circuitry. This was done primarily for convenience, as all components could typically be housed within a single enclosure.

Two Athena Power RM-1U1202B30 1U Rackmount Server Cases (available from Athena Power Corp, City of Industry, Calif.) were used. One case was used for the LEDs, heat sinks, and fans; the second was used for the power supplies and control circuitry. The 300 W ATX power supply (Athena Power AP-U1ATX30A) was removed from the LED case but left in the power supply case to provide 5 V and 12 V DC power for fans and indicator LEDs.

The LEDs used were a selection of Bridgelux® LED Arrays BXRA-C8000-00E0C (3), BXRA-N6300-00L0E (4), BXRA-W5700-00Q0E (4), BXRA-W5700-00S0E (1), available from Bridgelux Corp, Livermore, Calif. A Supermicro SNK-P0046P CPU heat sink measuring 95 mm×95 mm×27 mm (available from Super Micro Computer, Inc., San Jose, Calif.) was affixed to each LED. Sheet metal shrouds were fabricated to duct air through the heat sinks and out the back of the case. Aluminum brackets were designed and fabricated to align the LED arrays with the heat sinks, providing pressure at the LED array/heat sink interface and to align the 3 inch square duct segments. A thermal grease that came pre-applied to the heat sinks provided thermal contact with the LED arrays. Cooling fans (10 Delta FFB03812VHN-9C3P DC axial fans available from Digikey Electronics, Thief River Falls, Minn.)) were aligned in the LED case to provide airflow past the heat exchangers.

The power supply case included four LED driver boards that used a 48 VDC input and provide a constant current output suitable for driving the Bridgelux LED arrays. Each circuit card had three channels capable of delivering 3.5 to 3.75 A each. The driver boards accepted a 5 V pulse width modulated (PWM) signal for dimming control. A Murata Power Solutions 48 V DC Power supply (D1U-W-2000-48-HB2C 2000 W AC/48 V DC available from Murata Power Solutions, Smyrna, Ga.) was used to supply power to the LED driver boards. The component electronics equipment racks were mounted in a 45U server rack (SRP-8137 available from Bud Industries, Willoughby, Ohio), and the ducts positioned over the LEDs.

Optical measurements were performed using a Gooch & Housego OL 770-LED Test and Measurement System (available from Gooch & Housego Ltd, Somerset, UK) connected to a 2 meter diameter integrating sphere. The duct segments were removed, and the light engine and power supply cases were taken out of the rack and placed into the sphere. The power supply driver boards were adjusted prior to the optical measurements to deliver 3.5 A to 3.75 A to each LED array with the PWM control signals set at 100% duty cycle. The voltage drop was measured across each of the twelve LEDs, while substrate temperature was measured at six of the twelve, at the same time as the optical measurements. Two inlet air thermocouples and two outlet air thermocouples were mounted at the front and back of the LED case, respectively. Thermocouples and voltage measurement leads were connected to an Agilent 34921A Multiplexer Module hosted in a 34980A Multifunction Switch/Measure Unit mainframe (Agilent Technologies, Loveland, Colo., USA).

Total luminous flux (TLF) with all twelve LED arrays driven at 3.5 A to 3.75 A was measured near 100,000 lm, depending on temperature. LED temperatures leveled off at an average value of 64° C. and a TLF of 96,100 lm, with average air inlet and outlet temperatures of 29° C. and 44° C., respectively. Total system input power (AC wall power) was measured at 1772 W, using a "Watts up? PRO" meter (available from Electronic Educational Devices, Denver, Colo., USA). LED DC input power was estimated as 1300 W, based on the voltage measurements and 3.5 A to 3.75 A set points. These results yield system and LED efficacies of 54.2 lm/W and 73.9 lm/W, respectively. Based on the measured spectrum of this particular combination of sources, the luminous efficacy of radiation was 316 lm/W. A color rendering index (CRI) of 80.7 was achieved, with a correlated color temperature (CCT) of 4040 K.

The prototype rack-mounted light engine described herein represented just one configuration of many possible combinations of LED source and case layouts. A complete system may only include a single LED array feeding a single light duct. Alternately, a single case may contain two LED arrays, each with its own duct system, one illuminating the aisle to the front of the light engine and the other to the rear. For example, a rack-mounted light engine can be configured to supply two circular light ducts. The ducts can be suspended above the aisles and engineered to direct extracted light at the front and rear surfaces of the ducts. The light engines can be placed in the middle of the aisles, as a "T" junction in the middle of the main duct may be more efficient than a 90° bend at the end.

For example, assuming a 6' tall server rack and a duct system efficiency of 75%, a 100,000 lm light engine could illuminate over 240 linear feet of rack surface at 500 lux. A single 100,000 lm light engine in this configuration could illuminate a pair of aisles over 60 feet (18.3 m) in length. Three such light engines could be organized to light a 2500 square foot (232 sq m) data center floor plan.

Following are a list of embodiments of the present disclosure.

Item 1 is a rack-mounted light engine, comprising: an electronics enclosure comprising a plurality of components including at least one light source, the electronics enclosure configured to be mounted on a rack in an electronics cabinet; and at least one opening in the electronics enclosure for passing an emitted light from the at least one light source to an exterior of the electronics cabinet.

Item 2 is the rack-mounted light engine of item 1, wherein the plurality of components further includes at least one of a power supply and a cooling device in communication with the at least one light source.

Item 3 is the rack-mounted light engine of item 1 to item 2, wherein the cooling device comprises a fan, an air cooled heat exchanger, a liquid cooled heat exchanger, or a combination thereof.

Item 4 is the rack-mounted light engine of item 1 to item 3, wherein at least one of the plurality of components are modular and removable from the electronics enclosure, without removal of the electronics enclosure from the rack.

Item 5 is the rack-mounted light engine of item 1 to item 4, further comprising a light duct proximate the opening capable of collecting the emitted light from the at least one light source.

Item 6 is the rack-mounted light engine of item 1 to item 5, wherein the electronics cabinet is positioned vertically extending from a floor, and the opening is parallel to the floor.

Item 7 is the rack-mounted light engine of item 1 to item 6, wherein the electronics cabinet is positioned horizontally extending from a wall, and the opening is parallel to the wall.

Item 8 is the rack-mounted light engine of item 1 to item 7, wherein the at least one light source comprises a light emitting diode (LED).

Item 9 is a lighting system, comprising: a rack-mounted light engine disposed in a rack adjacent to an outer surface of an electronics cabinet, the rack-mounted light engine comprising a light source; and a light distribution duct positioned to accept an input light from the light source and distribute the input light to illuminate at least one of a front surface or a back surface of the electronics cabinet, and also to illuminate at least one adjacent electronics cabinet.

Item 10 is the lighting system of item 9, further comprising at least one of a power supply and a cooling device in communication with the light source.

Item 11 is the lighting system of item 10, wherein the cooling device comprises a fan, an air cooled heat exchanger, a liquid cooled heat exchanger, or a combination thereof.

Item 12 is the lighting system of item 9 to item 11, wherein the at least one adjacent electronics cabinet is located across an aisle from the electronics cabinet, located to a side of the electronics cabinet, or a combination thereof.

Item 13 is the lighting system of item 9 to item 12, wherein the at least one adjacent electronics cabinet includes a top surface, a second front surface, and a second back surface, and the input light illuminates at least one of the second front surface or the second back surface.

Item 14 is the lighting system of item 9 to item 13, wherein the light distribution duct is a mirror-lined hollow light duct.

Item 15 is the lighting system of item 9 to item 14, wherein the electronics cabinet is positioned vertically extending from a floor, and the outer surface is parallel to the floor.

Item 16 is the lighting system of item 9 to item 15, wherein the electronics cabinet is positioned horizontally extending from a wall, and the outer surface is parallel to the wall.

Item 17 is the lighting system of item 9 to item 16, wherein the light engine comprises a light emitting diode (LED).

Item 18 is the lighting system of item 9 to item 17, wherein the input light comprises light propagating within a collimation half-angle of a light propagation direction.

Item 19 is the lighting system of item 18, wherein the collimation half-angle is less than 30 degrees.

Item 20 is the lighting system of item 9 to item 19, wherein the light distribution duct further comprises a light extractor.

Item 21 is the lighting system of item 9 to item 20, wherein the light extractor comprises a turning film.

Item 22 is a data center lighting system, comprising: a first plurality of electronics cabinets arranged in a first row; a rack-mounted light engine disposed in a rack adjacent a top surface of one of the first plurality of electronics cabinets, the rack-mounted light engine comprising a light source; and a light distribution duct positioned to accept an input light from the light source and distribute the input light to at least one of a front surface and a back surface of at least two of the plurality of electronics cabinets.

Item 23 is the data center lighting system of item 22, wherein the light distribution duct comprises: a transport duct extending along a length of the first row; and a plurality of light extractors disposed along the transport duct, each of the light extractors capable of directing light toward one of the front surface or the back surface of an associated electronics cabinet of the plurality of electronics cabinets.

Item 24 is the data center lighting system of item 22 to item 23, further comprising at least one of a power supply and a cooling device in communication with the light source.

Item 25 is the data center lighting system of item 24, wherein the cooling device comprises a fan, an air cooled heat exchanger, a liquid cooled heat exchanger, or a combination thereof.

Item 26 is the data center lighting system of item 22 to item 25, wherein each of the light extractors comprises a turning film.

Item 27 is the data center lighting system of item 23 to item 26, wherein at least one of the light extractors comprise an extraction duct extending in a perpendicular direction from the transport duct, the extraction duct capable of directing light toward one of the front surface or the back surface of the associated electronics cabinet of the plurality of electronics cabinets.

Item 28 is a data center lighting system, comprising: a first plurality of electronics cabinets arranged in a first row, each of the first plurality of electronics cabinets having a first surface and an opposite second surface; a second plurality of electronics cabinets arranged in a second row parallel to the first row and separated by an aisle, each of the second plurality of electronics cabinets having a third surface facing the first surface; a rack-mounted light engine disposed in a rack adjacent a top surface of one of the first plurality of electronics cabinets, the rack-mounted light engine comprising a light source; and a light distribution duct positioned to accept an input light from the light source and distribute the input light to the first surface of at least one of the first plurality of electronics cabinets and the third surface of at least one of the second plurality of electronics cabinets.

Item 29 is the data center lighting system of item 28, further comprising at least one of a power supply and a cooling device in communication with the light source.

Item 30 is the data center lighting system of item 28 or item 29, wherein the cooling device comprises a fan, an air cooled heat exchanger, a liquid cooled heat exchanger, or a combination thereof.

Item 31 is the data center lighting system of item 28 to item 30, further comprising a third plurality of electronics cabinets in a third row parallel to the first row and separated by a second aisle, each of the third plurality of electronics cabinets having a fourth surface facing the second surface, wherein the light distribution duct further distributes the input light to the second surface of at least one of the first plurality of electronics cabinets and the fourth surface of at least one of the second plurality of electronics cabinets.

Item 32 is the data center lighting system of item 28 to item 31, wherein the light distribution duct comprises: a transport duct extending along a length of the first row; and a first plurality of light extractors disposed along the transport duct, each of the first plurality of extractors capable of directing light toward the first surface and the third surface of associated electronics cabinets of the first and second plurality of electronics cabinets.

Item 33 is the data center lighting system of item 32, wherein at least one of the first plurality of light extractors comprise an extraction duct extending in a perpendicular direction from the transport duct, the extraction duct capable of directing light toward the first surface and the third surface of associated electronics cabinets of the first and second plurality of electronics cabinets.

Item 34 is the data center lighting system of item 31 to item 33, wherein the light distribution duct comprises: a transport duct extending along a length of the first row; and a second plurality of light extractors disposed along the transport duct, each of the second plurality of light extractors capable of directing light toward the second surface and the fourth surface of associated electronics cabinets of the first and third plurality of electronics cabinets.

Item 35 is the data center lighting system of item 34, wherein at least one of the second plurality of light extractors comprise an extraction duct extending in a perpendicular direction from the transport duct, the extraction duct capable of directing light toward the second surface and the fourth surface of associated electronics cabinets of the first and third plurality of electronics cabinets.

Unless otherwise indicated, all numbers expressing feature sizes, amounts, and physical properties used in the specification and claims are to be understood as being modified by the term "about". Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A rack-mounted light engine, comprising:
   an electronics enclosure comprising a plurality of components including at least one light source within the electronics enclosure, the electronics enclosure configured to be mounted on a rack in an electronics cabinet; and
   at least one opening in the electronics enclosure for passing an emitted light from the at least one light source within the electronics enclosure to an exterior of the electronics cabinet; and
   a light duct proximate the opening in the electronics enclosure, wherein the light duct accepts input light exiting from the electronics cabinet.

2. The rack-mounted light engine of claim 1, wherein the plurality of components further includes at least one of a power supply and a cooling device in communication with the at least one light source.

3. The rack-mounted light engine of claim 2, wherein the cooling device comprises a fan, an air cooled heat exchanger, a liquid cooled heat exchanger, or a combination thereof.

4. The rack-mounted light engine of claim 2, wherein at least one of the plurality of components are modular and removable from the electronics enclosure, without removal of the electronics enclosure from the rack.

5. The rack-mounted light engine of claim 1, wherein the electronics cabinet is positioned vertically extending from a floor, and the opening is parallel to the floor.

6. The rack-mounted light engine of claim 1, wherein the electronics cabinet is positioned horizontally extending from a wall, and the opening is parallel to the wall.

7. The rack-mounted light engine of claim 1, wherein the at least one light source comprises a light emitting diode (LED).

8. A lighting system, comprising:
   a rack-mounted light engine disposed in a rack adjacent to an outer surface of an electronics cabinet, the rack-mounted light engine comprising a light source; and
   a light distribution duct positioned to accept an input light from the light source and distribute the input light to illuminate at least one of a front surface or a back surface of the electronics cabinet, and also to illuminate at least one adjacent electronics cabinet.

9. The lighting system of claim 8, further comprising at least one of a power supply and a cooling device in communication with the light source.

10. The lighting system of claim 9, wherein the cooling device comprises a fan, an air cooled heat exchanger, a liquid cooled heat exchanger, or a combination thereof.

11. The lighting system of claim 8, wherein the at least one adjacent electronics cabinet is located across an aisle from the electronics cabinet, located to a side of the electronics cabinet, or a combination thereof.

12. The lighting system of claim 8, wherein the at least one adjacent electronics cabinet includes a top surface, a second front surface, and a second back surface, and the input light illuminates at least one of the second front surface or the second back surface.

13. The lighting system of claim 8, wherein the light distribution duct is a mirror-lined hollow light duct.

14. The lighting system of claim 8, wherein the electronics cabinet is positioned vertically extending from a floor, and the outer surface is parallel to the floor.

15. The lighting system of claim 8, wherein the electronics cabinet is positioned horizontally extending from a wall, and the outer surface is parallel to the wall.

16. The lighting system of claim 8, wherein the rack-mounted light engine comprises a light emitting diode (LED).

17. The lighting system of claim 8, wherein the input light comprises light propagating within a collimation half-angle of a light propagation direction.

18. The lighting system of claim 17, wherein the collimation half-angle is less than 30 degrees.

19. The lighting system of claim 8, wherein the light distribution duct further comprises a light extractor.

20. The lighting system of claim 19, wherein the light extractor comprises a turning film.

21. A data center lighting system, comprising:
a first plurality of electronics cabinets arranged in a first row;
a rack-mounted light engine disposed in a rack adjacent a top surface of one of the first plurality of electronics cabinets, the rack-mounted light engine comprising a light source; and
a light distribution duct positioned to accept an input light from the light source and distribute the input light to at least one of a front surface and a back surface of at least two of the first plurality of electronics cabinets.

22. The data center lighting system of claim 21, wherein the light distribution duct comprises:
a transport duct extending along a length of the first row; and
a plurality of light extractors disposed along the transport duct, each of the light extractors capable of directing light toward one of the front surface or the back surface of an associated electronics cabinet of the first plurality of electronics cabinets.

23. The data center lighting system of claim 21, further comprising at least one of a power supply and a cooling device in communication with the light source.

24. The data center lighting system of claim 23, wherein the cooling device comprises a fan, an air cooled heat exchanger, a liquid cooled heat exchanger, or a combination thereof.

25. The data center lighting system of claim 22, wherein each of the light extractors comprises a turning film.

26. The data center lighting system of claim 22, wherein at least one of the light extractors comprise an extraction duct extending in a perpendicular direction from the transport duct, the extraction duct capable of directing light toward one of the front surface or the back surface of the associated electronics cabinet of the first plurality of electronics cabinets.

27. A data center lighting system, comprising:
a first plurality of electronics cabinets arranged in a first row, each of the first plurality of electronics cabinets having a first surface and an opposite second surface;
a second plurality of electronics cabinets arranged in a second row parallel to the first row and separated by an aisle, each of the second plurality of electronics cabinets having a third surface facing the first surface;
a rack-mounted light engine disposed in a rack adjacent a top surface of one of the first plurality of electronics cabinets, the rack-mounted light engine comprising a light source; and
a light distribution duct positioned to accept an input light from the light source and distribute the input light to the first surface of at least one of the first plurality of electronics cabinets and the third surface of at least one of the second plurality of electronics cabinets.

28. The data center lighting system of claim 27, further comprising at least one of a power supply and a cooling device in communication with the light source.

29. The data center lighting system of claim 28, wherein the cooling device comprises a fan, an air cooled heat exchanger, a liquid cooled heat exchanger, or a combination thereof.

30. The data center lighting system of claim 27, further comprising a third plurality of electronics cabinets in a third row parallel to the first row and separated by a second aisle, each of the third plurality of electronics cabinets having a fourth surface facing the second surface, wherein the light distribution duct further distributes the input light to the second surface of at least one of the first plurality of electronics cabinets and the fourth surface of at least one of the second plurality of electronics cabinets.

31. The data center lighting system of claim 27, wherein the light distribution duct comprises:
a transport duct extending along a length of the first row; and
a first plurality of light extractors disposed along the transport duct, each of the first plurality of light extractors capable of directing light toward the first surface and the third surface of associated electronics cabinets of the first and second plurality of electronics cabinets.

32. The data center lighting system of claim 31, wherein at least one of the first plurality of light extractors comprise an extraction duct extending in a perpendicular direction from the transport duct, the extraction duct capable of directing light toward the first surface and the third surface of associated electronics cabinets of the first and second plurality of electronics cabinets.

33. The data center lighting system of claim 30, wherein the light distribution duct comprises:
a transport duct extending along a length of the first row; and
a second plurality of light extractors disposed along the transport duct, each of the second plurality of light extractors capable of directing light toward the second surface and the fourth surface of associated electronics cabinets of the first and third plurality of electronics cabinets.

34. The data center lighting system of claim 33, wherein at least one of the second plurality of light extractors comprise an extraction duct extending in a perpendicular direction from the transport duct, the extraction duct capable of directing light toward the second surface and the fourth surface of associated electronics cabinets of the first and third plurality of electronics cabinets.

\* \* \* \* \*

UNITED STATES PATENT AND TRADEMARK OFFICE
CERTIFICATE OF CORRECTION

PATENT NO. : 9,719,673 B2
APPLICATION NO. : 14/397503
DATED : August 1, 2017
INVENTOR(S) : Karl Geisler Page 1 of 1

It is certified that error appears in the above-identified patent and that said Letters Patent is hereby corrected as shown below:

In the Specification

Column 5
Line 13-14, delete "luminaries" and insert -- luminaires --, therefor.

Column 7
Line 41, delete "2010;" insert -- 2010 (Attorney Docket No. 66725US002); --, therefor.
Line 43, delete "2011;" insert -- 2011 (Attorney Docket No. 67372US002); --, therefor.
Line 44, delete "2011;" insert -- 2011 (Attorney Docket No. 67374US002); --, therefor.
Line 45, delete "2011;" insert -- 2011 (Attorney Docket No. 67375US002); --, therefor.
Line 47, delete "1012." and insert -- 2012 (Attorney Docket No. 68048US002). --, therefor.

Column 9
Line 55, delete "illumination." and insert -- illumination of the floor 305 in the third aisle 308. --, therefor.

Signed and Sealed this
Nineteenth Day of March, 2019

Andrei Iancu
*Director of the United States Patent and Trademark Office*